United States Patent
Resnick

(10) Patent No.: US 8,055,852 B2
(45) Date of Patent: *Nov. 8, 2011

(54) MEMORY DEVICE AND METHOD HAVING ON-BOARD PROCESSING LOGIC FOR FACILITATING INTERFACE WITH MULTIPLE PROCESSORS, AND COMPUTER SYSTEM USING SAME

(75) Inventor: David Resnick, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 254 days.

This patent is subject to a terminal disclaimer.

(21) Appl. No.: 11/893,593

(22) Filed: Aug. 15, 2007

(65) Prior Publication Data

US 2009/0049250 A1 Feb. 19, 2009

(51) Int. Cl.
*G06F 12/06* (2006.01)
*G06F 12/00* (2006.01)

(52) U.S. Cl. ........ 711/147; 711/118; 711/105; 711/104; 711/5

(58) Field of Classification Search .............. 711/105, 711/154, 104, 5, 147, 118
See application file for complete search history.

(56) References Cited

U.S. PATENT DOCUMENTS

| | | | |
|---|---|---|---|
| 4,796,232 A | 1/1989 | House | 365/189 |
| 4,975,878 A | 12/1990 | Boddu et al. | 365/189.07 |
| 5,067,071 A | 11/1991 | Schanin et al. | 395/275 |
| 5,163,139 A | 11/1992 | Haigh et al. | 395/375 |
| 5,457,482 A | 10/1995 | Rhoden et al. | 345/201 |
| 5,488,583 A | 1/1996 | Ong et al. | 365/201 |
| 5,737,757 A | 4/1998 | Hassoun et al. | 711/145 |
| 5,802,541 A | 9/1998 | Reed | 711/1 |
| 6,049,487 A | 4/2000 | Plants et al. | 365/189.04 |
| 6,081,876 A | 6/2000 | Brewer et al. | 711/163 |
| 6,321,314 B1 | 11/2001 | Van Dyke | 711/163 |
| 6,378,049 B1 | 4/2002 | Stracovsky et al. | 711/147 |
| 7,320,100 B2 * | 1/2008 | Dixon et al. | 714/758 |
| 7,421,564 B1 | 9/2008 | Rahim et al. | 711/219 |
| 7,565,593 B2 * | 7/2009 | Dixon et al. | 714/754 |
| 7,676,728 B2 * | 3/2010 | Resnick et al. | 714/764 |
| 2003/0018860 A1 | 1/2003 | Krueger | 711/152 |
| 2004/0093467 A1 | 5/2004 | Shen et al. | |
| 2005/0022065 A1 * | 1/2005 | Dixon et al. | 714/42 |
| 2005/0097276 A1 | 5/2005 | Lu et al. | 711/118 |
| 2005/0144375 A1 * | 6/2005 | Bains et al. | 711/105 |
| 2005/0207257 A1 * | 9/2005 | Skidmore | 365/230.01 |
| 2006/0047886 A1 | 3/2006 | Leaback | 711/5 |
| 2006/0190671 A1 * | 8/2006 | Jeddeloh | 711/5 |
| 2007/0067556 A1 * | 3/2007 | Dixon et al. | 711/106 |

(Continued)

FOREIGN PATENT DOCUMENTS

EP 0718769 6/1996

Primary Examiner — Mardochee Chery
(74) Attorney, Agent, or Firm — Dorsey & Whitney LLP

(57) ABSTRACT

A memory device includes an on-board processing system that facilitates the ability of the memory device to interface with a plurality of processors operating in a parallel processing manner. The processing system includes circuitry that performs processing functions on data stored in the memory device in an indivisible manner. More particularly, the system reads data from a bank of memory cells or cache memory, performs a logic function on the data to produce results data, and writes the results data back to the bank or the cache memory. The logic function may be a Boolean logic function or some other logic function.

3 Claims, 3 Drawing Sheets

U.S. PATENT DOCUMENTS

| | | | |
|---|---|---|---|
| 2007/0101238 A1* | 5/2007 | Resnick et al. | 714/763 |
| 2007/0113150 A1* | 5/2007 | Resnick et al. | 714/763 |
| 2009/0049245 A1 | 2/2009 | Resnick | 711/118 |
| 2009/0049264 A1 | 2/2009 | Resnick | 711/163 |
| 2011/0029712 A1 | 2/2011 | Resnick | 711/5 |

* cited by examiner

MEMORY DEVICE AND METHOD HAVING ON-BOARD PROCESSING LOGIC FOR FACILITATING INTERFACE WITH MULTIPLE PROCESSORS, AND COMPUTER SYSTEM USING SAME

TECHNICAL FIELD

This invention relates generally to memory devices, and, more particularly, to a memory device and method that facilitates access by multiple memory access devices, as well as memory systems and computer systems using the memory devices.

BACKGROUND

As computer and computer system architecture continues to evolve, the number of processing cores and threads within cores is increasing geometrically. This geometric increase is expected to continue, even for simple, relatively inexpensive computer systems. For server systems, system sizes measured in the number of processors are increasing at an even faster rate.

Although this rapid increase in the number of scores and threads enhances the performance of computer systems, it also has the effect of making it difficult to apply the increasing parallelism to single applications. This limitation exists even for high-end processing tasks that naturally lend themselves to parallel processing, such as, for example, weather prediction. One of the major reasons for this limitation is that the number of communication paths between processors, cores, and threads increases disproportionately to the number of times the task is divided into smaller and smaller pieces. Conceptually, this problem can be analogized to the size of a processing being represented by the volume of a 3D cube. Each time this volume is divided into smaller cubes, the total surface area of the cubes, which represents data that must be communicated between the processors working on sub-cubes, increases. Every time that the number of processors goes up by a factor of eight the total amount of information to be communicated between the greater number of processors doubles.

One reason for these problems caused by increasing parallelism is that most systems communicate by sending messages between processors, rather than sharing memory. This approach results in high latencies and high software overheads, although it may simplify some complex system architecture, operating system, and compiler issues. Unfortunately, as the level of parallelism increases, the processors in the system reach the point where all they are doing is managing message traffic rather than actually doing useful work.

There is therefore a need for a system and method that can reduce software overhead and eliminate or at least reduce performance bottlenecks thereby improving system performance and architectural scalability at relatively low cost.

DETAILED DESCRIPTION

Figure 1:
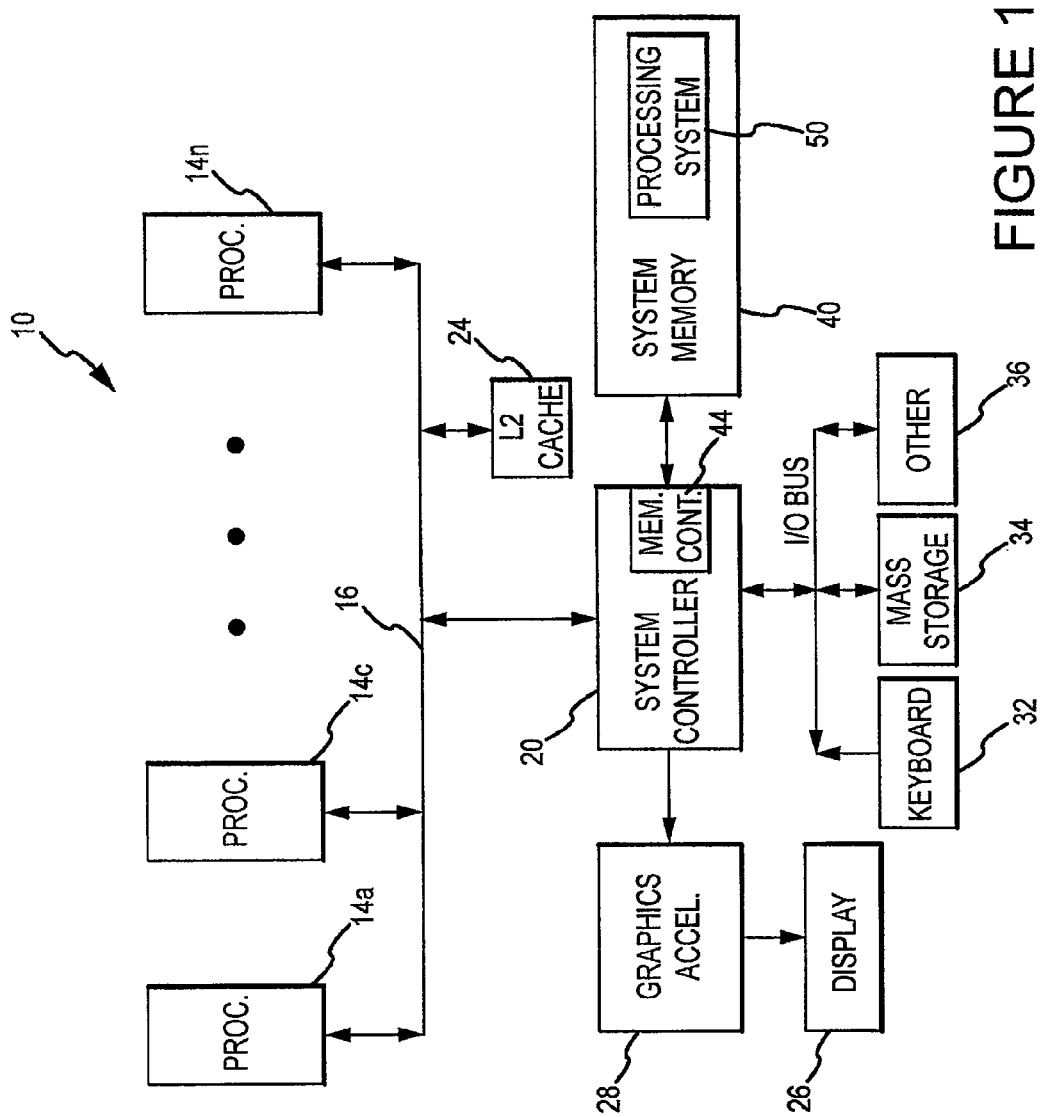
FIG. 1 is a block diagram of a computer system according to one embodiment.

A computer system 10 according to one embodiment is shown in FIG. 1. The computer system 10 includes several parallel processors $14_{1-N}$ connected to a common processor bus 16. Also connected to the processor bus 16 are a system controller 20 and a level 2 ("L2") cache 24. As is well known in the art, each of the processors $14_{1-N}$ may include a level 1 ("L1") cache.

The system controller 20 drives a display 26 through a graphics accelerator 28, which may include a graphics processor and graphics memory of conventional design. Also connected to the system controller 20 is an input/output ("I/O") bus 30, such as a peripheral component interconnect ("PCI") bus, to which are connected a keyboard 32, a mass storage device 34, such as a hard disk drive, and other peripheral devices 36. Of course there can also be systems such as servers, that do not have directly connected keyboard, graphics or display capabilities, for example.

The computer system 10 also includes system memory 40, which may be a dynamic random access memory ("DRAM") device or sets of such devices. The system memory 40 is controlled by memory controller circuitry 44 in the system controller 20 through a memory bus 46, which normally includes a command/status bus, an address bus and a data bus. There are also systems in which the system and memory controller is implemented directly within a processor IC. As described so far, the computer system 10 is conventional. However, the system memory 40 departs from conventional systems by including in the system memory 40 a processing system 50 that enhancers the ability of the parallel processors $14_{1-N}$ to access the system memory 40 in an efficient manner. It should also be understood that the system 50 may be used in memory devices in a computer or other processor-based systems that differ from the computer system 10 shown in FIG. 1. For example, servers and other high-end systems will generally not include the graphics accelerator 28, the display 26, the keyboard 32, etc., but will have disk systems or simply connect to a network of other similar processors with attached memory.

The processing system 50 includes circuitry that allows the system memory 40 to be naturally coherent by carrying out operations in the memory device an indivisible manner. The system reduces or eliminates coherency issues and may improve communication for all levels in the computer system 10. The processing system 50 or a processing system according to some other embodiment can be implemented in the system memory 40 while keeping the internal organization of the memory system substantially the same as in conventional system memories. For example, bank timing and memory data rates can be substantially the same. Further, the system 50 need not be particularly fast as the operations needed are generally simple and fit with current and anticipated memory clock rates.

In general, it is preferable for the processing to be initiated and to be performed as a single indivisible operation. An example is where a byte in a 32-bit word is updated (read and then written) while preventing access to the word while the update is being executed. Functions like these, which are sometime referred to as "atomic," are desired when parallel processes access and update shared data. The processing system 50 allows the system memory 40 to be naturally coherent by performing operations as an indivisible whole with a single access. The coherency circuitry reduces or eliminates coherency issues and may improve communication for all levels in the computer system 10. The coherency circuitry operates most advantageously when used with other extensions to the functionality of memory devices, such as that provided by a cache system.

Figure 2:
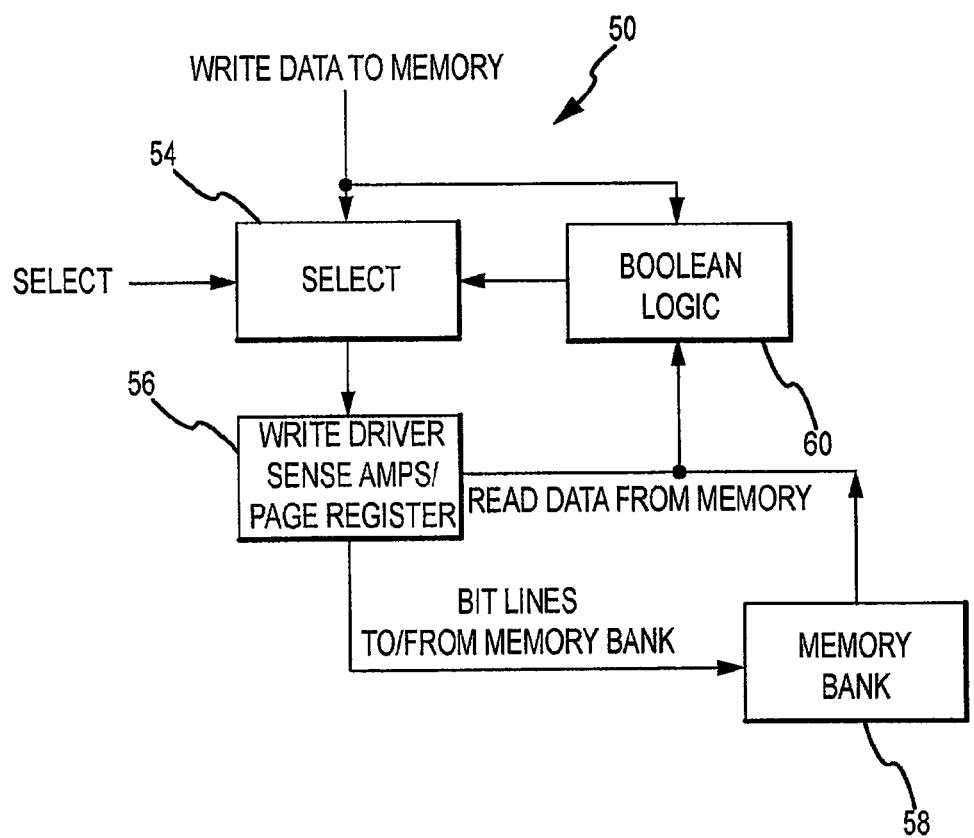
FIG. 2 is block diagram of a portion of a system memory device containing processing logic according to one embodiment that may be used in the computer system of FIG. 1 to allow operations to be carried out in the memory device in an indivisible manner.

One embodiment of a processing system 50 is shown in FIG. 2. The system 50 includes a select circuit 54, which may be a multiplexer, that routes write data to a column of a Memory Bank 58 through a set of write drivers 56. The write data are routed to the column from either a data bus of the memory device 40 or Boolean Logic 60. The Boolean Logic 60 receives read data from a set of sense amplifiers and page registers 56. The read data are also applied to the data bus of the memory device 40.

In operation, the select circuit 54 normally couples write data directly to the write drivers 56 of the Bank 58. However, in response to a command from the memory controller 44, the select circuit 54 routes data from the Boolean Logic 60 to the write drivers 56. In response to a read command, the read data are applied to the Boolean Logic 60, and the Boolean Logic 60 then performs a Boolean logic operation on the read data and writes data resulting from the operation back to the location in the Bank 58 where the data was read. If the memory device 40 includes a cache memory, the Boolean Logic 60 can instead perform an operation on data read from the cache memory before writing the result data back to the same location in the cache memory.

Although the system 50 shown in FIG. 6 uses Boolean Logic 60, other embodiments may use circuits or logic that perform other increased functions. In general, this increased functionality may be logic functions, such as AND, OR, etc. functions, arithmetic operations, such as ADD and SUB, and similar operations that can update and change the contents of memory. Arithmetic functions would be very useful to multiple different kinds of software. However, as indicated above, the system 150 performs Boolean logic operations since they are also very useful functions to implement as flags and for general communication between computation threads, cores, and clusters. A Boolean operation is a standalone bit-operation since no communication between bits participating in the operation is generally required, and can be implemented efficiently on a memory die. As each Boolean operation is simple, the logic implementing the functions does not have to be fast compared to the memory clock. These functions provide coherency directly as memory is modified in the memory device. These functions, in conjunction with the protection capability described previously, enable system implementation of a set of easy to use but novel memory functions.

Typical logical functions that may be implemented by the Boolean Logic 60 are shown in Table 1, below. The increased functionality can provide solutions to many of the issues that surround the increased parallelism of new computer implementations.

The basic operation that is performed to implement the logic functions is: WriteData .OP. MemData→MemData where ".OP." is a value designating a specified Boolean logic function. Memory data is modified by data contained in what is basically a Write operation, with the result returned to the same place in memory that sourced the data. An on-chip data cache can be source and/or sink of the data that is operated on by the Boolean Logic 160. If the data source is a memory bank rather than a cache memory, an Activate to a bank specified in the command should also be issued, with the page data loaded into the normal row buffer. Write data accompanying the command is then applied to the row buffer at the specified column addresses. The result is written back to memory, though this could be under control of a Precharge bit in the Boolean logic 60. The operation is thus a Write, but with memory data itself modifying what is written back to memory. If the data source is a cache memory, then a cache row is fetched, such as by using tag bits as described previously. After the data read from the cache memory is transformed by the logic operation, the result data are stored at the same location in the cache memory.

In operation, there may be multiple different kinds of OPs, so as to enable memory bits to be set, cleared and complemented. As detailed below, this write-up shows eight different operations. A particular set of command bits are not shown here to encode the particular Boolean logic function because the implementation can be independent of the cache memory operations described previously. If combined with the use of a cache memory, a cache reference command as described above may be used. This cache reference command may be encoded using a respective set of RAS, CAS, WE, DM command signals. A set of commands is shown in Table 1, below. The manner in which those command bits map to DRAM command bits my be defined in a variety of manners. However, one embodiment of a set of instructions and an instruction mapping is shown in Table 1 in which "W" designates a write bit received by the memory device, "M" designates a bit of data read from either a bank of memory cells or the cache memory, "●" is an AND function, "+" is an OR function, and "⊕" is an exclusive OR function.

Figure 3:
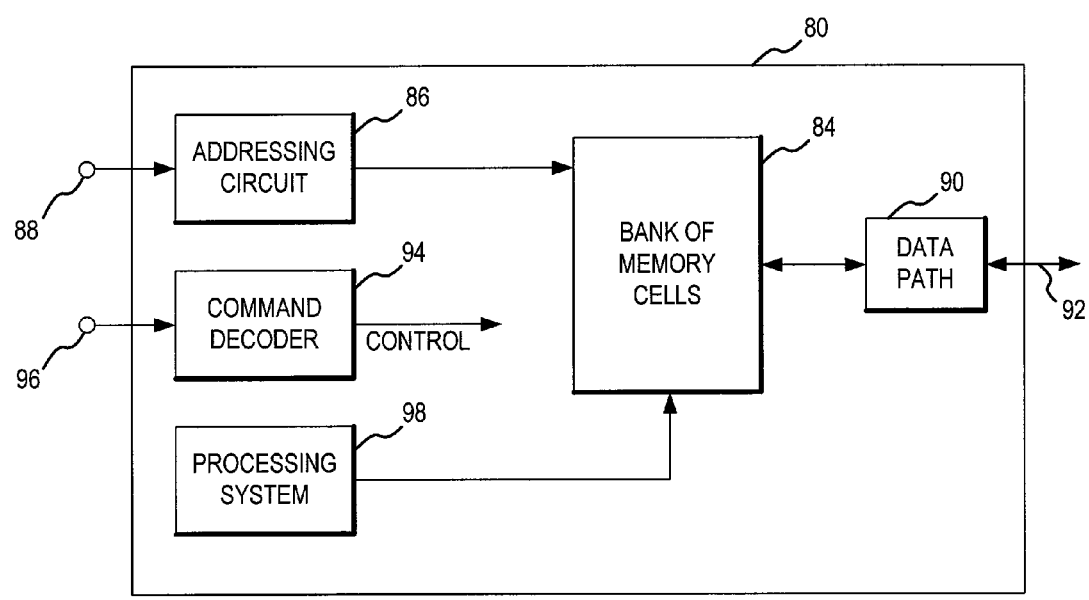
FIG. 3 is a block diagram of a memory device according to one embodiment that may be used in the computer system of FIG. 1.

FIG. 3 shows one embodiment of a memory device 80. The memory device 80 includes at least one bank of memory cells 84 coupled to an addressing circuit 86 that is coupled between external terminals 88 and the at least one bank of memory cells 84. The memory device 80 also includes a data path 90 coupled between 92 external terminals and the at least one bank of memory cells 84. Also included in the memory device 80 is a command decoder 94 coupled to external terminals 96. The command decoder 94 is operable to generate control signals to control the operation of the memory device 80. Finally, the memory device 80 includes a processing system 98 coupled to the at least one bank of memory cells 84. The processing system is operable to perform a processing function on data read from the at least one bank of memory cells 84 to provide results data and to write the results data to the at least one bank of memory cells 84. The processing system 50 shown in FIG. 2 may be used as the processing system 98, or some other embodiment of a processing system may be used as the processing system 98.

TABLE 2

Boolean Functions

| OP Code (octal) | Primary Equation | Alternate Equation | Common Name | Operation |
|---|---|---|---|---|
| 0 | $W \cdot M$ | | AND | Clear on 0's |
| 1 | $\overline{W} \cdot M$ | | | Clear on 1's |
| 2 | $W \oplus M$ | | XOR | Complement on 1's |
| 3 | $\overline{W} \cdot \overline{M}$ | $\overline{W+M}$ | NOR | NOR |
| 4 | $\overline{W \cdot M}$ | $\overline{W} + \overline{M}$ | NAND | NAND |
| 5 | $\overline{W \oplus M}$ | | EQV | Complement on 0's |
| 6 | $\overline{W \cdot \overline{M}}$ | $\overline{W} + M$ | | Set on 0's |
| 7 | $\overline{\overline{W} \cdot M}$ | $W + \overline{M}$ | OR | Set on 1's |

Notes:
1 "W" is a write bit coming from the input pins.
2 "M" is a memory bit
3 "·" is AND
4 "+" is OR
5 "⊕" is Exclusive OR From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A computer system, comprising:
a plurality of processors operating in parallel to perform parallel processing functions;
a system controller coupled to the processors, the system controller including a memory controller; and
a system memory device coupled to the memory controller, the system memory device comprising:
at least one bank of memory cells;
an addressing circuit coupled to the memory controller, the addressing circuit being operable to address the at least one bank of memory cells responsive to address signals received from the memory controller;
a data path coupled to the memory controller, the data path being operable to couple write data from the memory controller and to couple read data from the at least one bank of to the memory controller;
a command decoder coupled to the memory controller, the command decoder being operable to generate control signals to control the operation of the memory device responsive to memory command signals received from the memory controller; and
a processing system within the system memory device coupled to the at least one bank of memory cells, the processing system being configured to be responsive to a command from one of the plurality of processors to perform an indivisible update operation in the system memory device in which the processing system reads data from a location in the at least one bank of memory cells, the processing system performs a processing function on the data read from the location in the at least one bank of memory cells to provide results data, and the processing system writes the results data to the same location in the at least one bank of memory cells from which the read data was read, the processing system preventing access to the data read from the location in the at least one bank of memory cells by any of the plurality of processors while the indivisible update operation is being performed.

2. The computer system of claim 1 wherein the processing system comprises:
a logic circuit coupled to receive read data from the memory controller, the logic circuit being operable to perform a processing function on the read data to provide results data; and
a select circuit having a first input coupled to receive write data from the memory controller, a second input coupled to the logic circuit to receive the results data, an output coupled to provide write data to the at least one bank of memory cells, and a control input receiving a control signal from at least one of the processors, the control signal alternately causing write data to be coupled from the memory controller to the at least one bank of memory cells or to cause the results data to be coupled from the logic circuit through the data path to the at least one bank of memory cells.

3. The computer system of claim 2 wherein the processing function performed by the logic circuit comprises a Boolean logic function.

* * * * *